(12) United States Patent
Sarrafzadeh et al.

(10) Patent No.: US 6,851,099 B1
(45) Date of Patent: Feb. 1, 2005

(54) PLACEMENT METHOD FOR INTEGRATED CIRCUIT DESIGN USING TOPO-CLUSTERING

(75) Inventors: Majid Sarrafzadeh, Wilamette, IL (US); Salil R. Raje, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 09/511,705

(22) Filed: Feb. 23, 2000

Related U.S. Application Data

(63) Continuation-in-part of application No. 09/097,107, filed on Jun. 12, 1998, now Pat. No. 6,442,743.

(51) Int. Cl.[7] ............................................. G06F 17/50
(52) U.S. Cl. ................................ 716/10; 716/2; 716/8; 716/9; 716/11; 716/7
(58) Field of Search ........................... 716/10–14, 7–9, 716/2

(56) References Cited

U.S. PATENT DOCUMENTS

| | | | | |
|---|---|---|---|---|
| 5,276,789 A | * | 1/1994 | Besaw et al. | 395/140 |
| 5,491,641 A | | 2/1996 | Scepanovic et al. | 364/491 |
| 5,495,419 A | | 2/1996 | Rostoker et al. | 364/468 |
| 5,526,517 A | | 6/1996 | Jones et al. | 395/600 |
| 5,557,533 A | | 9/1996 | Koford et al. | 364/491 |
| 5,636,125 A | | 6/1997 | Rostoker et al. | 364/468.28 |
| 5,661,663 A | | 8/1997 | Scepanovic et al. | 364/490 |
| 5,682,321 A | | 10/1997 | Ding et al. | 364/490 |
| 5,682,322 A | | 10/1997 | Boyle et al. | 364/491 |
| 5,699,265 A | | 12/1997 | Scepanovic et al. | 364/491 |
| 5,712,793 A | | 1/1998 | Scepanovic et al. | 364/490 |
| 5,909,376 A | * | 6/1999 | Scepanovic et al. | 364/491 |
| 6,099,580 A | * | 8/2000 | Boyle et al. | 716/7 |
| 6,145,117 A | * | 11/2000 | Eng | 716/18 |
| 6,286,128 B1 | * | 9/2001 | Pileggi et al. | 716/18 |

(List continued on next page.)

OTHER PUBLICATIONS

Kim et al, "An Improved Hierarchical Placement Technique Using Clustering & Region Refinement," IEEE, 1996, pp. 393–396.*

(List continued on next page.)

*Primary Examiner*—Vuthe Siek
(74) *Attorney, Agent, or Firm*—Bever, Hoffman & Harms, LLP; Jeanette S. Harms

(57) ABSTRACT

The present invention, generally speaking, provides a placement method for the physical design of integrated circuits in which natural topological feature clusters (topo-clusters) are discovered and exploited during the placement process. Initial placement and placement refinement may be performed hierarchically using topocluster trees. A topocluster tree may be used to drive initial placement. An iterative placement refinement process then follows, using a technique referred to herein as Geometrically-Bounded FM (GBFM). In GBFM, FM is applied on a local basis to windows encompassing some number of bins. From iteration to iteration, windows may shift position and vary in size. When a region bounded by a window meets a specified cost threshold in terms of a specified cost function, that region does not participate. The cost function takes account of actual physical metrics-delay, area, congestion, power, etc. During placement refinement using GBFM, cluster size is adjusted iteratively from large to small as determined by horizontal cuts within the topocluster tree. GBFM occurs in the context of recursive quadrisection. Hence, after GBFM has been completed, a further quadrisection step is performed in which each bin is divided into four bins, with a quarter of the gates of the original bin being placed in the center of each of the resulting bins. GBFM then follows, and the cycle repeats until each bin contains a fairly small number of gates. Topocluster trees may also be used for quadrisection. Following the foregoing global placement process, the circuit is then ready for detailed placement in which cells are assigned to placement rows.

42 Claims, 13 Drawing Sheets

OTHER PUBLICATIONS

Gupta et al, "A Hierarchical Technique for Minimum–Width Layout of Two–Dimensional CMOS Cells, " IEEE, 1996, pp. 15–20.*

Fiduccia et al., "A Linear–Time Heuristic for Improving Network Partitions", *IEEE 19th Design Automation Conference*, pp. 175–181 (1982).

Huang et al., "Partitioning–Based Standard–Cell Global Placement With an Exact Objective", *International Symposium on Physical Design*, pp. 18–25, ACM (1997).

Kernighan et al., "An Efficient Heuristic Procedure for Partitioning Graphs", *Bell System Technical Journal*, 49:291–307 (1970).

Kleinhans et al., "GORDIAN: VLSI Placement by Quadratic Programming and Slicing Optimization", *IEEE Transactions on Computer–Aided Design*, 10(3):356–365 (1991).

Sarrafzadeh et al., "NRG: Global and Detailed Placement", *IEEE International Conference on Computer–Aided Design*, pp. 532–537 (1997).

Suaris et al., "Quadrisection: A New Approach to Standard Cell Layout", *IEEE International Conference on Computer–Aided Design*, pp. 474–477 (1987).

* cited by examiner

Iteration i → Iteration i+1

Cells in center → Cells assigned to rows

- Algorithm GBFM_one_level(w,s,r)

for (i= 1 to r)

for (j= 0 to s-1)

{ Consider the a wxw grid superimposed on the bins.

Shift the grid up and right by s units.

Perform GBMF within each wxw window

- Algorithm dual_GBFM for (temp= t down to 1)

{ for (i= 1 to k)  // k should be a small constant like 3

{ while (there exists a region with cost > cost(t) or

{ Reg = a region randomly selected among regions with cost

Perform quanto-cluster level FM within Reg.

} // end of while while (there exists a region with cost > cost(t) or

{ Reg = a region randomly selected among regions with cost

Perform gate level FM within Reg.

} // end of while

} // end of for i

} // end of for temp

FIG. 10

Input circuit

Seven topoclusters

Placement refinement
global move

Placing topoclusters
in the bins

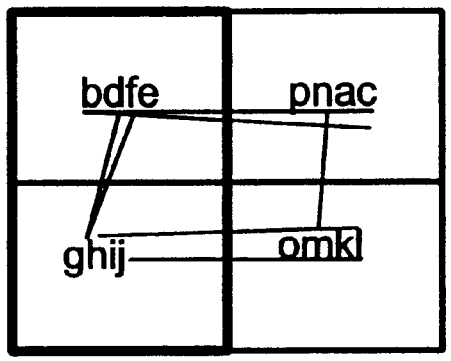
Placement refinement
local move
FIG. 15
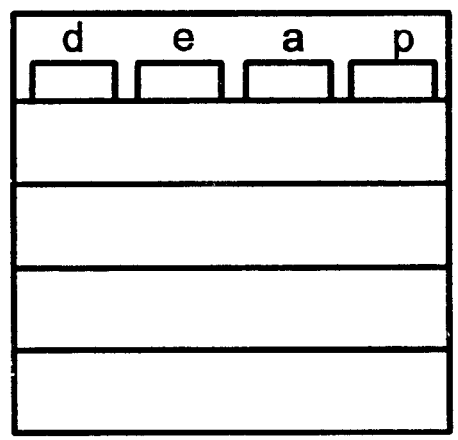
FIG. 16
FIG. 17
Done
FIG. 18
Router FIG. 20
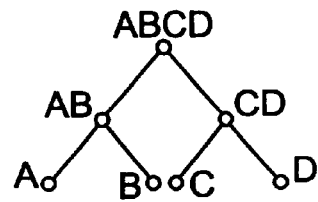
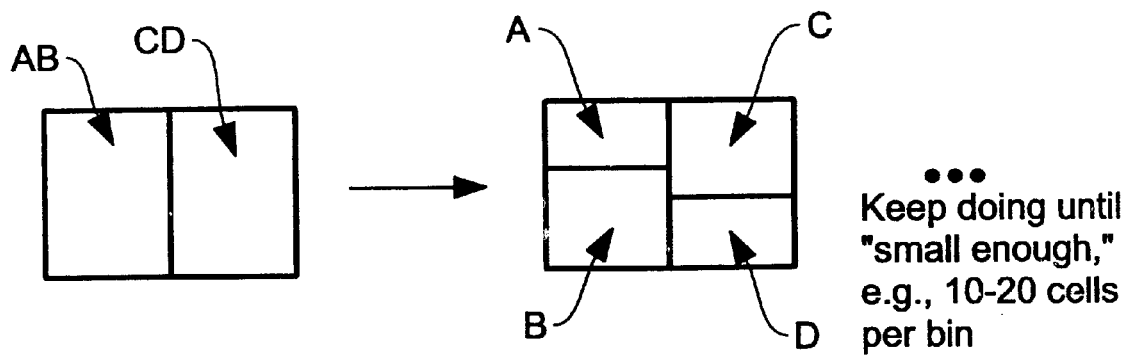
Keep doing until "small enough," e.g., 10-20 cells per bin
FIG. 21
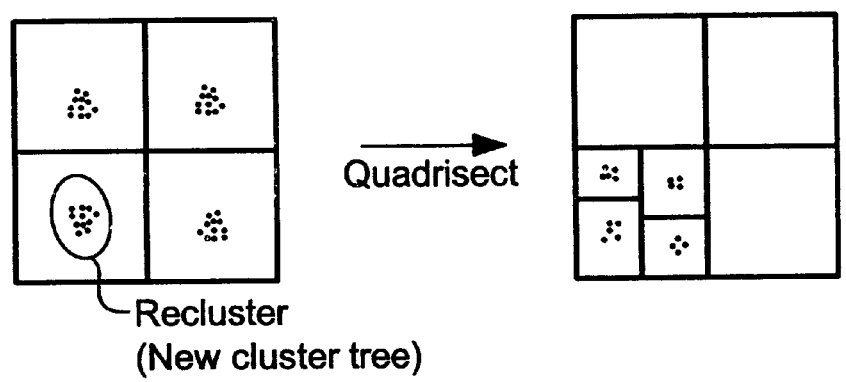
Recluster
(New cluster tree)
FIG. 25

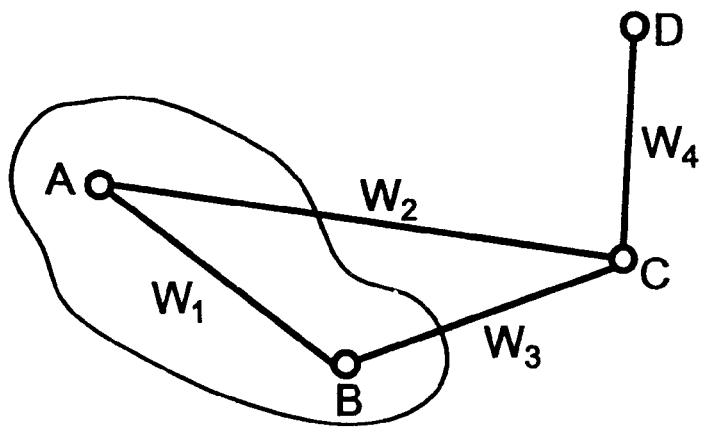
FIG. 28A
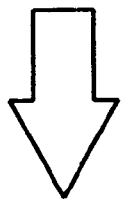
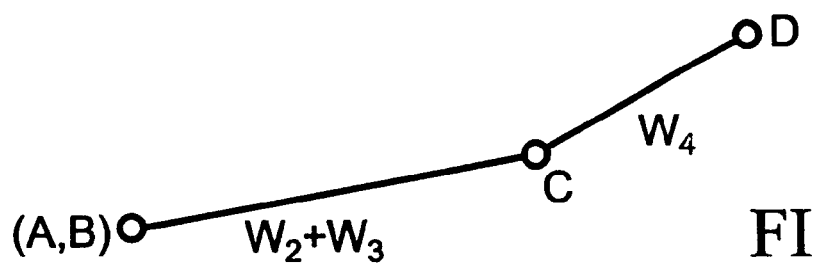
FIG. 28B

PLACEMENT METHOD FOR INTEGRATED CIRCUIT DESIGN USING TOPO-CLUSTERING

RELATED APPLICATION

The present application is a Continuation-in-part of U.S. Ser. No. 09/097,107 filed on Jun. 12, 1998 now U.S. Pat. No. 6,442,743, incorporated herein by reference.

BACKGROUND OF THE INVENTION

1. Field of the Invention

The present invention relates to placement in integrated circuit design.

2. State of the Art

The physical design of integrated circuits involves placement of gates within a design layout, representing a physical integrated circuit, and routing of interconnections (nets) between gates. The logical integrated circuit design is represented in the form of a netlist, i.e., a list of gates or collections of gates (tnacros) and nets interconnecting them. A graph representation of a netlist is shown in FIG. 1A. Through placement and routing, the logical integrated circuit design is translated to a physical integrated circuit design. Placement and routing are performed using Electronic Design Automation (EDA) software tools running on powerful computers.

Placement and routing are closely inter-related. As integration density increases, the sheer size of integrated circuit designs challenges current methods of physical design. Furthermore, physical design is required to be more exacting in order to avoid deleterious interactions and to ensure that all design constraints are met.

A number of approaches to the placement problem have been proposed, including simulated annealing, genetic algorithms, mathematical/linear programming, bisection type approaches, etc. One widely-practiced partitioning algorithm known as FM after its originators Fiuccia and Matheyses, is used as the basis for many placement algorithms. In FM, groups of features are formed, and features are exchanged between the groups so as to minimize the number of nets extending between the groups. The FM technique, an example of a module partitioning heuristic, may be represented as follows:

1. Determine initial partition of modules. 2. Loop until no more improvement in the partition results, or until a maximum number of passes is tried:
   a. Free all modules and compute module gains.
   b. Loop while there remains a free module that can be moved:
      i. Select next module to be moved (select free module of maximum gain, subject to area-balance criterion).
      ii. Move selected module to opposite side of partition.
      iii. Update module gains.
   c. Reconstruct best partition of pass.

Gain refers to decrease in the number of nets crossing between opposite sides of the partition.

A major shortcoming of the foregoing technique, as well as other similar techniques, is that after a partition has been made, it is difficult or impossible for gates or modules to cross the partition boundary. This restriction often results in inferior placements. A cycling and overlapping partitioning process is described in Huang and Kahng, Partitioning-Based Standard Cell with an Exact Objective, Proc. of the International Symposium on Physical Design, April 1997. This approach, to a limited extent, does allow gates and modules to cross partition boundaries. However, the approach is not cluster-based (is slow) and does not exploit the full power of cycling and overlapping partitioning (produces less-than-adequate quality).

In short, none of these existing placement techniques appears well-equipped to meet the challenges of the deep sub-micron era.

SUMMARY OF THE INVENTION

The present invention, generally speaking, provides a placement method for the physical design of integrated circuits in which natural topological feature clusters (topo-clusters) are discovered and exploited during the placement process. Initial placement and placement refinement may be performed hierarchically using topocluster trees. A topocluster tree may be used to drive initial placement. An iterative placement refinement process then follows, using a technique referred to herein as Geometrically-Bounded FM (GBFM). In GBFM, FM is applied on a local basis to windows encompassing some number of bins. From iteration to iteration, windows may shift position and vary in size. When a region bounded by a window meets a specified cost threshold in terms of a specified cost function, that region does not participate. The cost function takes account of actual physical metrics-delay, area, congestion, power, etc. During placement refinement using GBFM, cluster size is adjusted iteratively from large to small as determined by horizontal cuts within the topocluster tree. GBFM occurs in the context of recursive quadrisection. Hence, after GBFM has been completed, a further quadrisection step is performed in which each bin is divided into four bins, with a quarter of the gates of the original bin being placed in the center of each of the resulting bins. GBFM then follows, and the cycle repeats until each bin contains a fairly small number of gates. Topocluster trees may also be used for quadrisection. Following the foregoing global placement process, the circuit is then ready for detailed placement in which cells are assigned to placement rows.

BRIEF DESCRIPTION OF THE DRAWING

The present invention may be further understood from the following description in conjunction with the appended drawing. In the drawing:

FIG. 9 is a pseudo-code representation of a placement refinement process;

FIG. 10 is a pseudo-code representation of a placement refinement process in accordance with an alternative embodiment;

FIG. 15 is a diagram showing the results of a local move during placement refinement;

FIG. 16 is a diagram showing the results of quadrisection following the move of FIG. 15;

FIG. 17 is a diagram showing row placement of cells represented by the nodes a–k;

FIG. 18 is a diagram of a final routed integrated circuit produced by the foregoing steps;

FIG. 20 is a diagram of a topocluster tree;

FIG. 21 is a diagram illustrating initial placement using a topocluster tree;

FIG. 25 is a diagram illustrating quadrisection using topocluster trees;

FIG. 28A is diagram of a simple topocluster graph; and FIG. 28B is a resulting topocluster graph following the merger of clusters A and B in the topocluster graph of FIG. 28A.

DETAILED DESCRIPTION OF THE PREFERRED EMBODIMENTS

The present placement method is guided by a number of important decisions that contribute to the overall strength of the placement method. First, the placement method is based on clustering. Present day designs are too large to be considered in flat mode. Gates must therefore be clustered to reduce the design space. Second, the placement method is based on quadrisection techniques. Quadrisection techniques are extremely fast as compared to annealing or mathematical programming methods. Quadrisection, as opposed to bisection, better models the two-dimensional nature of the placement problem. Third, the piacement technique allows for gates to cross quadrisection boundaries.

Figure 8:
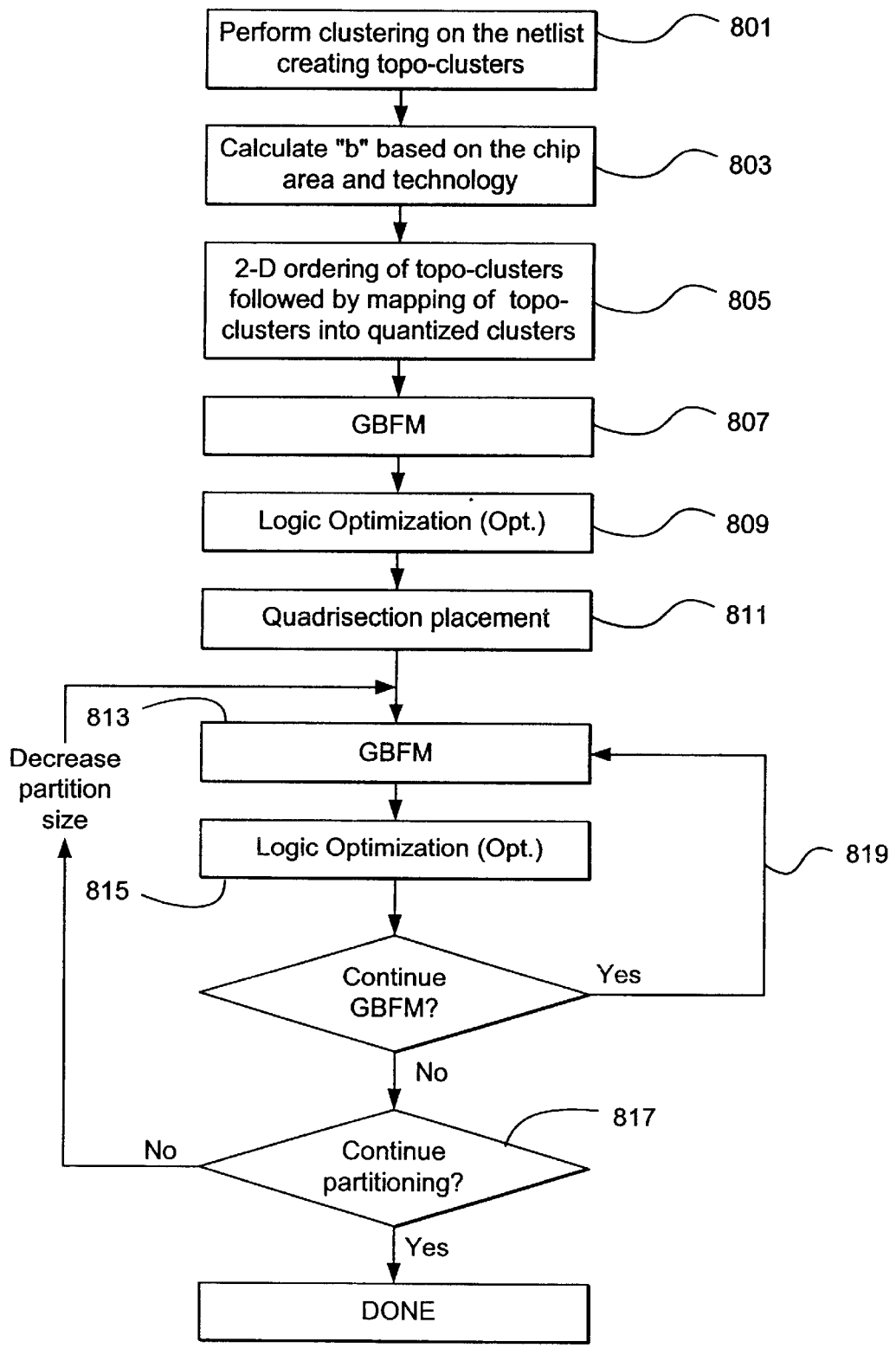
FIG. 8 is a flow diagram illustrating the placement process.

Referring to FIG. 8, a flow diagram of the present placement method is shown. The input to the placement process is assumed to be a netlist. In Step 801, clustering is performed on the netlist, creating topo-clusters. Then a layout is formed as an array of b×b "bins." The number of bins b is determined based on technology-specific considerations (803). A 2-D ordering of topo-clusters is then performed, followed by mapping of topo-clusters into "quanto-clusters" (865). A quanto-cluster is a bin-size portion of a topo-cluster, and may include the entire topo-cluster. A cycling and overlapping partitioning process is then performed (807), referred to herein as Geometrically Bounded FM, or GBFM, described in greater detail hereinafter. Logic optimization may optionally be performed! (809), after which quadrisection is performed (811). During quadrisection, each bin is divided into four bins one-fourth the size. A loop then ensues of GBFM (813), optional logic optimization (815), and quadrisection (811), until the bins each contain a relatively small number of gates, e.g. ten or a few tens of gates. Partitioning is then discontinued (817). Nested within this outer loop is an inner loop 819 within which GBFM may be performed repeatedly.

Figure 1A:
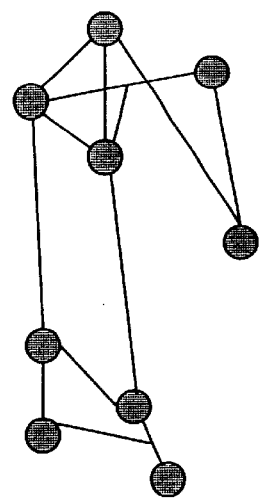
FIG. 1A is a diagram representing a netlist.
Figure 1B:
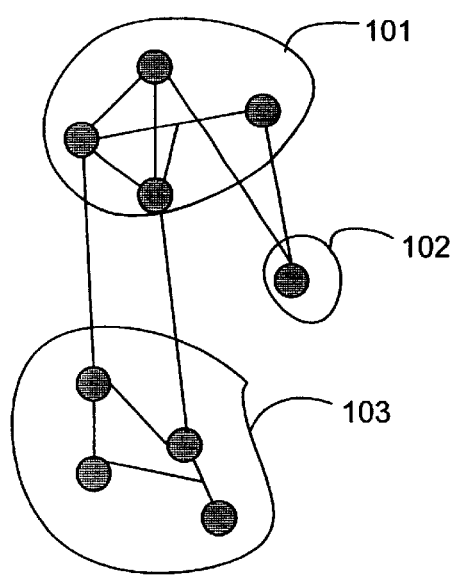
FIG. 1B is a diagram in which topo-clusters have been identified within the netlist of FIG. 1A.
Figure 1C:
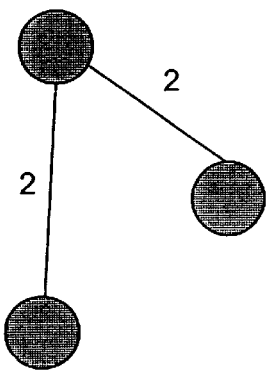
FIG. 1C is a course netlist in which the topo-clusters of FIG. 1C are each represented as a single feature.

The concept of clustering is illustrated in FIG. 1B. During clustering, topologically-related circuit elements are grouped together. In FIG. 1B, three clusters are shown, clusters 101, 103, and 105. Following clustering, the circuit may be represented in the form of a coarse netlist in which clusters are elemental and are joined by inter-cluster nets.

Clustering may be accomplished by various techniques including, for example, techniques based on functional similarity, netlist distance, and genus analysis. Each of these variations will be described in turn.

The nature of netlists makes clustering based on functional similarity quite straightforward. Each cell instance is given a unique name. Related cell instances are given cell names that are quite evidently related. For example, a register might be composed of some number of flip-flops. These flip-flops may have the instance names top/u1/registers/control_ff[7], top/u1/registers/control_ff[6], . . . top/u1/registers/control_ff[0]. A netlist parser may readily form clusters based on instance name relatedness. Alternatively, information concerning functional relatedness may be determined during logic synthesis based on a high level (e.g., Verilog, VHDL) description and preserved within the netlist format itself. The latter approach is preferable in that functional relatedness is best determined based on a high-level description, but may not be possible if the input netlist does not already include information concerning functional relatedness.

In distance-based clustering, whether two gates belong to the same cluster is determined based on a distance measure. The distance of two gates in a circuit can be defined as the minimum number of nets (or gates) visited in going from the first gate to the second. A bottom-up clustering method is used. Initially, each circuit element is its own cluster. Clusters are then merged to form larger clusters, based on distance considerations.

Figure 2:
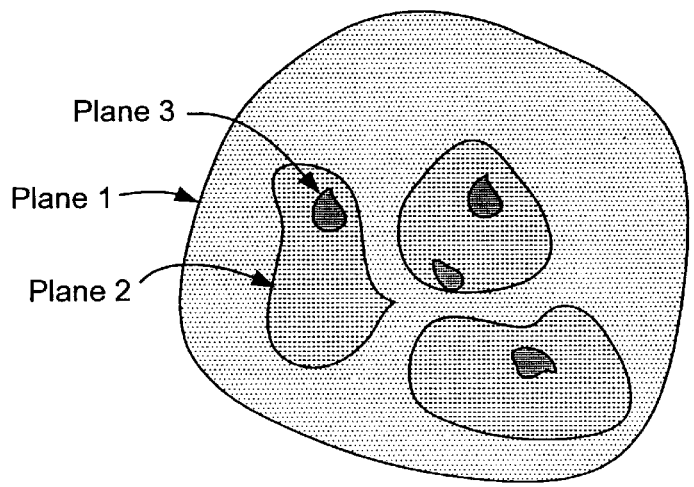
FIG. 2 is a diagram representing a netlist with genus 3.

Clustering may also be performed based on hyper-graph analysis of the netlist graph. A hyper-graph is a graph in which each edge of the graph may have multiple endpoints. A planar graph is one in which no graph edges cross. The genus of a hyper-graph is the number of planar sub-graphs needed to represent it. FIG. 2 shows a representation of a netlist having genus 3. Genus analysis of a hyper-graph may be performed as follows. First a maximal planar netlist of the original netlist is obtained. This planar netlist is said to be on plane 1. The planar netlist is deleted and a new planar netlist is obtained. The second planar netlist is said to be on plane 2. This process repeats until all nets have been removed. The total number of planes obtained is called the genus of the (original) netlist. This process provides insight into the complexity of the netlist. Furthermore, regions that are highly non-planar (as determined by the above analysis) can be clustered together.

Clusters formed by any of the foregoing methods, or by other methods that take into account circuit topology, are referred to as natural clusters or topological (topo) clusters.

The identification of clusters may involve trial and error. The following cost function may be used in evaluating the quality of a topo-clustering:

$$Kij=(Pij-1)/(Ti-1)$$

where Kij is the "credit" of net Ni in cluster j, Pij is the total number of terminals of net Ni in cluster j and Ti is the total number of terminals of net i. The absorption cut benefit, K, is defined as the summation of Kij over all nets and all topo-clusters. If m denotes the number of topo-clusters, a good topo-clustering is one with large values of K and m.

The usefulness of topo-clusters is evident in both obtaining a good initial placement of circuit elements and in performing placement refinement. Using topo-clusters, the initial placement may be expected to have a significantly lower cost function (and hence be significantly closer to the final placement) than if topo-clusters are not used. Also, using topo-clusters, the cost function of the placement may be reduced in a more computationally-efficient manner.

Figure 3:
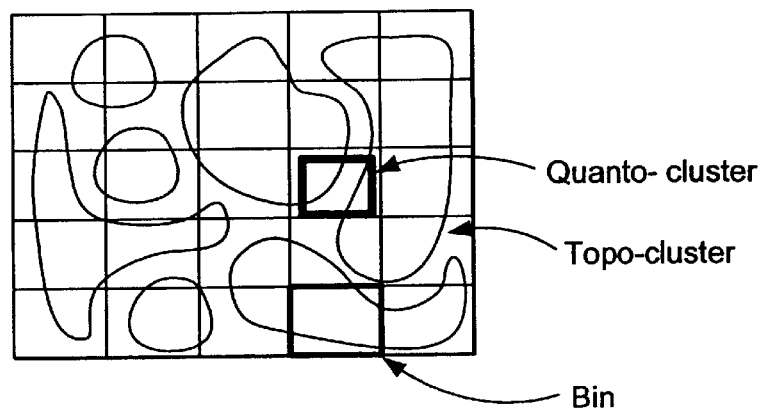
FIG. 3 is a simplified diagram representing an initial placement of topo-clusters on a placement layout, resulting in quanto-clusters.

In one exemplary embodiment, initial placement is performed by, beginning in the center of the design layout, using the bins in a predetermined spiral order to place each cluster in turn in as many bins as required by the cluster, as shown in FIG. 3. In placing topo-clusters, the topo-clusters become "bin-quan-tized" to form quanto-clusters. In an alternative embodiment, initial placement is performed in serpentine fashion, e.g., in row-major order for a first row of bins, reverse-row-major order for a succeeding row of bins, then row-major order again, etc. Preferably, topo-clusters are not placed in random order but rather are ordered based on a measure of the inter-relatedness of different topo-clusters.

Following initial placement, placement refinement occurs. Placement refinement is performed iteratively, each iteration involving quadrisection followed by a variant of FM, referred to herein as Dual GBFM. "Dual" refers to the fact that moves are performed first at the quanto-cluster level and then at the gate level. Dual GBFM differs from conventional FM in numerous respects, including the following:

1. Initial placement has already been performed. Moves may therefore be evaluated based on an actual physical cost function, e.g., one that measures congestion (routability), area, timing improvement, power, etc.
2. GBFM is applied selectively (by region) and iteratively. Conventional FM, in general, is applied universally and recursively.
3. Moves include cluster-level moves, followed by gate-level moves.
4. GBFM is multi-way. Although the possibility of multi-way FM ihas been recognized, virtually all commercial applications of FM have been two-way because of the large computational cost of multi-way FM. Using a shifting-window approach, GBFM achieves a comparable effect as large multi-way FM but in a way that is computationally mageable.

Figure 4A:
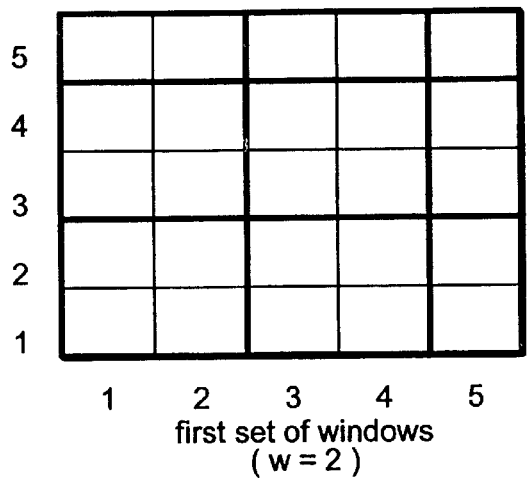
FIG. 4A is a diagram showing a first set of windows used to perform GBFM.
Figure 4B:
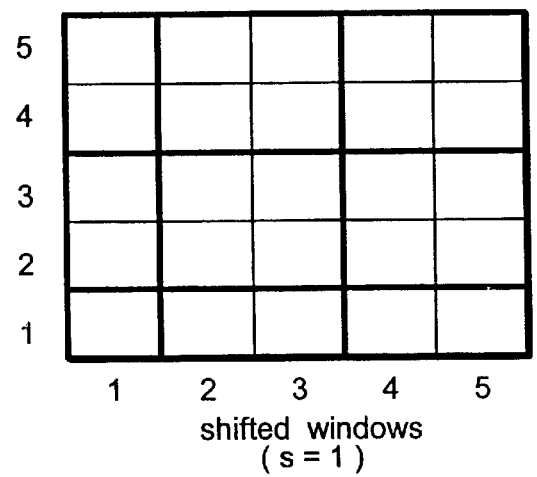
FIG. 4B is a diagram showing a second shifted set of window.

The GBFM process allows cells assigned to one partition to freely move to another partition using a controlled mechanism. GBFM, in accordance with exemplary embodiments, is described by the pseudo-code routines of FIG. 9 and FIG. 10. Referring first to FIG. 9, at a particular level of quadrisection, a windowpane overlay is applied to the design layout, as illustrated in FIG. 4A. GBFM is performed within each window. GBFM is multi-way FM using a geometric cost function, i.e., a cost function that is a function of distance, area, etc., not merely a function of "cuts" (topology). The windows are then redefined by shifting the window-pane overlay such that the new windows partially overlap the previous windows, as illustrated in FIG. 4B, and the process is repeated. The parameters w, s and r define a window size, a shift amount, and the number of repetitions (or rounds), respectively. In early stages of the placement process, the value of w should be large, and r should also be large. In later stages of the placement process, w should be small, s can be larger, and r should be small. The three parameters may be adjusted as a function of the given netlist, based on topo-clusters. For example, if analysis reveals a large number of disconnected topo-clusters, then w may be small, s may be large and r may be small. The large number of disconnected topo-clusters makes the problem easier, hence the window size may be reduced, saving work for the algorithm. In general, the parameters w, s and r may be determined empirically for different types of circuit layout problems; thereafter, the algorithm may be "tuned" for different circuit layout problems by adjusting the parameters w, s and r.

GBFM operates both on a quanto-cluster (bin) basis (first half of GBFM) and on a gate basis (second half of GBFM).

Referring to FIG. 10, in accordance with an alternative embodiment, GBFM uses a notion of temperature (as in simulated annealing, for example). The result of introducing the notion of temperature is that initially only moves that will result in fairly substantial improvement in the cost function are considered (high temperature, high cost threshold). In later stages, moves that will result in more modest improvement are considered (low temperature, low cost threshold). Instead of considering a large number of regions (windows) systematically and exhaustively, regions are randomly selected based on temperature and cost. Computational savings may therefore result. In an exemplary embodiment, at each temperature, a small number of iterations of GBFM are performed.

Figure 5:
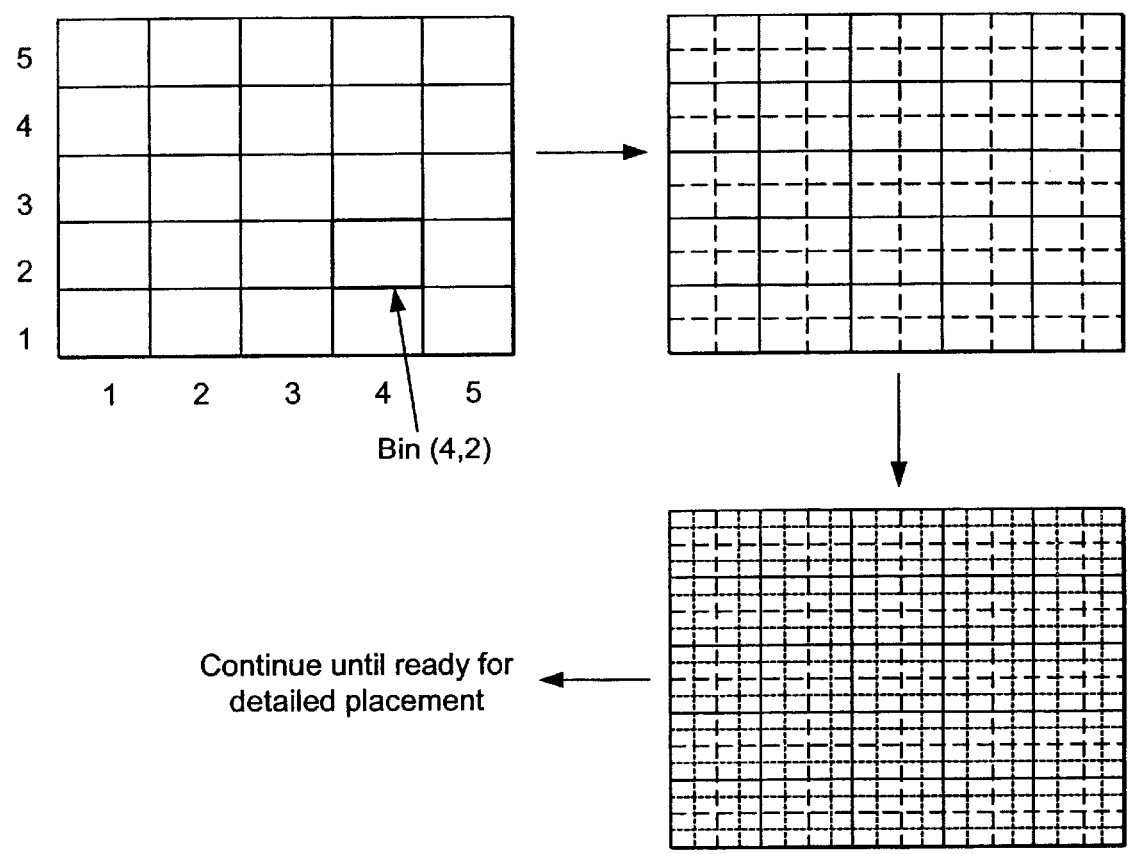
FIG. 5 is a diagram representing a quadrisection process.
Figure 6:
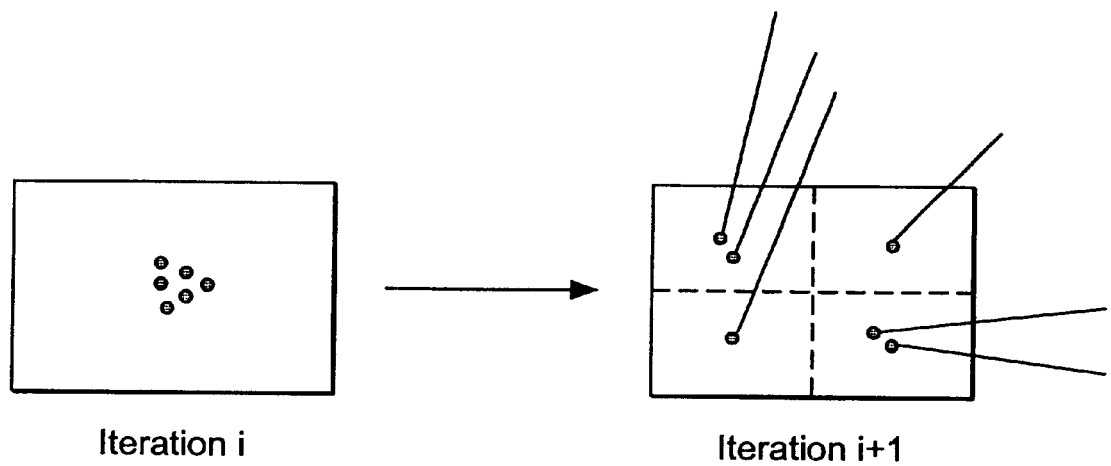
FIG. 6 is a diagram representing quadrisection in greater detail.

Following GBFM, quadrisection is again performed as illustrated in FIG. 5. During quadrisection, the circuit elements are divided into fourths, with one fourth of the circuit elements being placed in each of four new bins, as illustrated in FIG. 6. The circuit elements are placed in the center of the new bins. Quadrisection is followed again by GBFM. This process repeats until each bin contains a small number of gates, e.g. ten or a few tens of gates.

Figure 7:
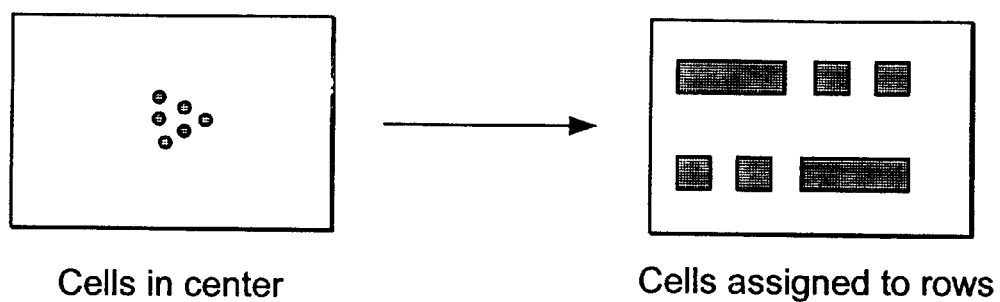
FIG. 7 is a diagram representing detailed placement.

Following the foregoing global placement process, the circuit is then ready for detailed placement in which cells are assigned to placement rows as illustrated in FIG. 7.

Figure 11:
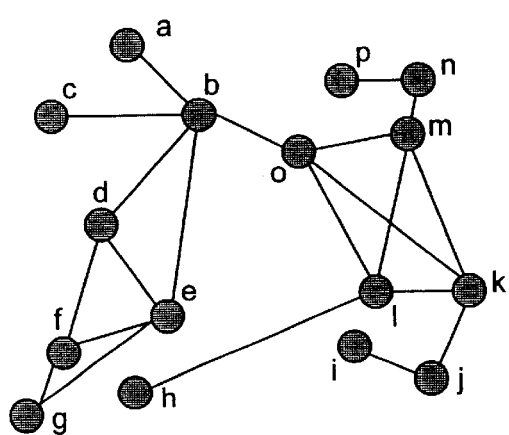
FIG. 11 is a graph representing an example netlist.
Figure 12:
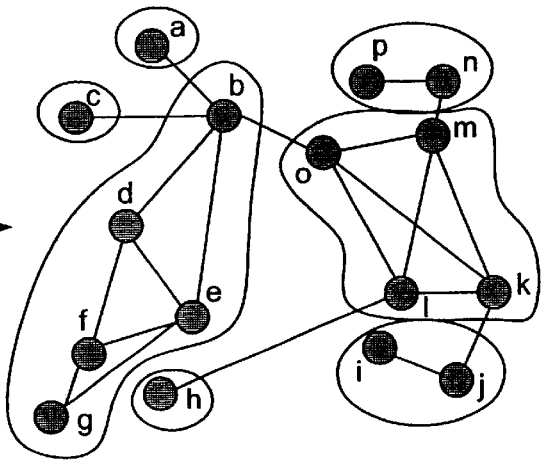
FIG. 12 is a topo-cluster diagram based on the graph of FIG. 11.
Figure 13:
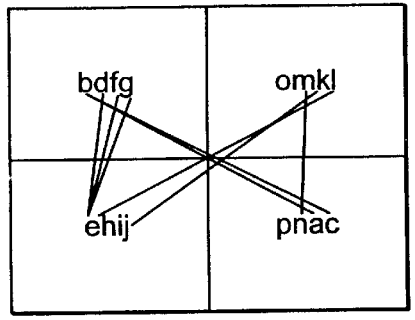
FIG. 13 is a diagram of quanto-clusters formed from the topo-clusters of FIG. 12.

The foregoing process may be more fully understood with reference to a specific example. Referring to FIG. 11, an example netlist is shown as represented by a graph. Each of the nodes a–p represents a cell. As a preliminary step, clustering is performed based on any of the described techniques or other suitable clustering techniques. In the present example, clustering is assumed to result in seven topo-clusters as shown in FIG. 12. Topo-clusters are then placed in bins defined as part of the design layout. For example, referring to FIG. 13, the topocluster omkl is placed in the upper right-hand bin, forming its own quanto-cluster. Part of the topo-cluster bdefg is placed in the upper left-hand bin, with the remainder of the topo-cluster (e) being placed in the lower left-hand bin. The cells, bdefg therefore form a quanto-cluster. The topo-clusters h and ij are also placed in the lower left-hand bin. The cells ehij form another quanto-cluster. Finally, the topo-clusters pn, a and c are placed in the lower right-hand bin, forming a quanto-cluster. Initially, all of the cells in a bin are placed in the center of the bin.

Figure 14:
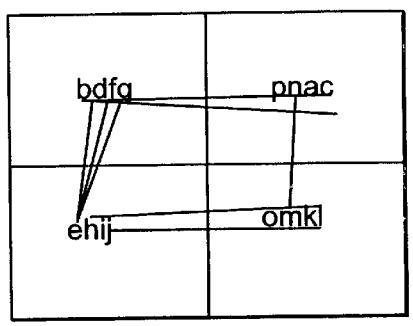
FIG. 14 is a diagram showing the results of a global move during placement refinement.

Placement refinement then ensues, beginning with global moves, i.e., exchange of quanto-clusters, followed by local moves, i.e., exchange of gates. Global moves and local moves are applied within regions (windows) as previously described. In FIG. 14, the window encompasses the upper and lower right-hand bins. Within this window, exchange of the quanto-clusters omkl and pnac results in a cost improvement. In FIG. 15, at a later stage, during a local move phase, the window encompasses the upper and lower left-hand bins. Within this window, exchange of the cells e and g results in a cost improvement.

Following GBFM, quadrisection then follows. Each bin is divided into four smaller bins and the cells within the bin are divided into four groups, each group being parcelled out to a different one of the new smaller bins. In the simplified example, as shown in FIG. 16, quadrisection results in a single cell being placed in the center of each of the resulting cells. The iteration of GBFM and quadrisection therefore concludes, although in the chosen example only a single iteration occurred. In an actual example, a large number of iterations may be expected to occur. The cells are then placed within placement rows (FIG. 17) and subsequently routed (FIG. 18).

The present invention may be embodied in various forms, including computer-implemented methods, computer systems configured to implement such methods, computer-readable media containing instructions for implementing such methods, etc. Examples of computer-implemented methods embodying the invention have been described. Reducing such methods to tangible form as computer-readable media may be accomplished by methods well-known in the art.

Figure 19:
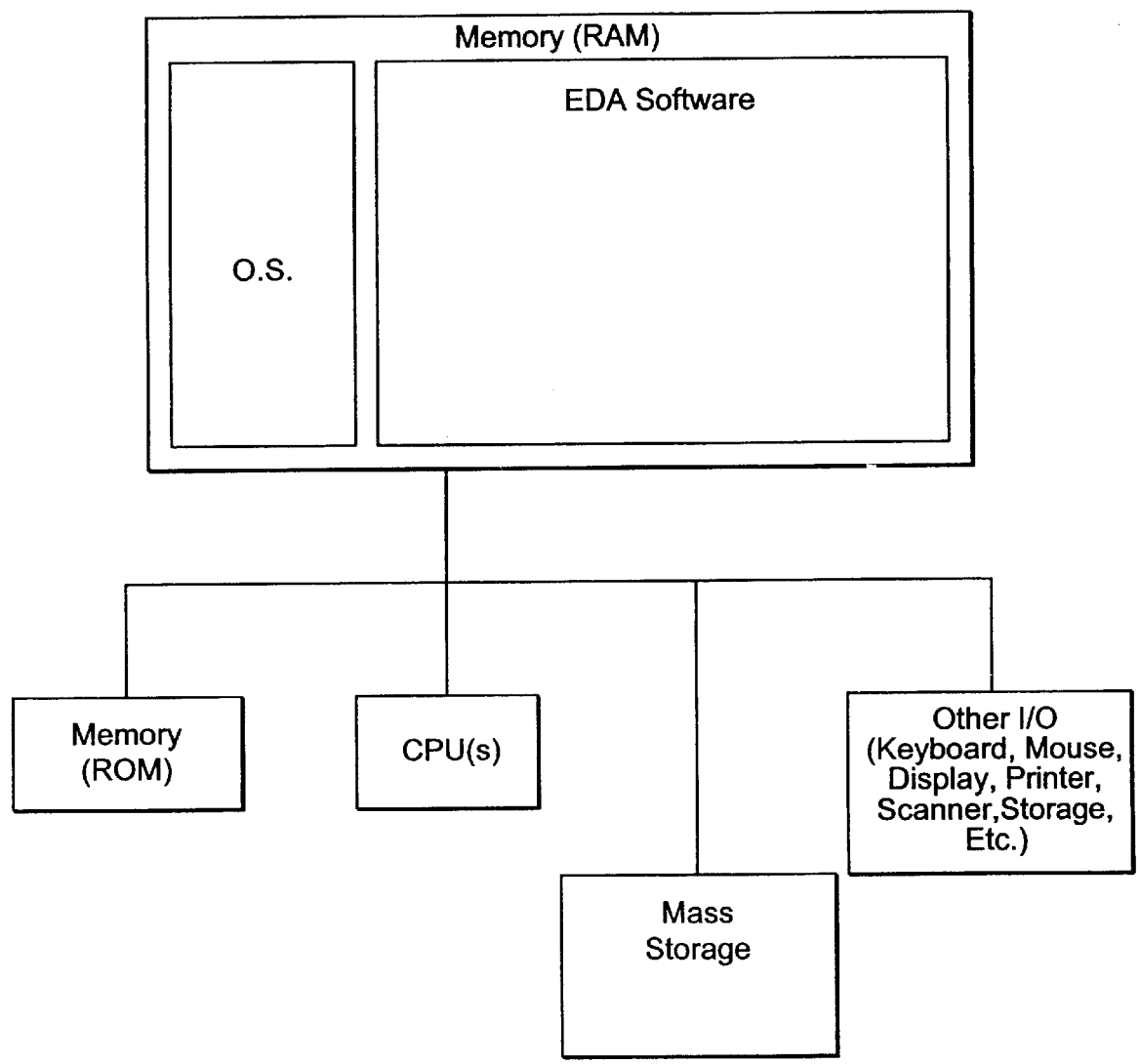
FIG. 19 is a block diagram of a computer system that may be used to practice the present invention.

Referring to FIG. 19, a diagram is shown of a computer system that may be used to practice the present invention. Attached to a system bus are one or more CPUs, read-only memory (ROM), read/write memory (RAM), mass storage, and other I/O devices. The other I/O devices will typically include a keyboard, a pointing device, and a display, and may further include any of a wide variety of commercially-available I/O devices, including, for example, magnetic storage devices, optical storage devices, other storage devices, printers, etc. Stored within memory (e.g., RAM) is EDA software implementing methods of the type previously described.

Hierarchical Initial Placement and Placement Refinement Using Topocluster Trees

The foregoing placement algorithms may be further improved using the notion of topocluster trees.

Referring to FIG. 20, a simple example of an idealized topocluster tree is shown. Leaf nodes of the tree correspond to integrated circuit cells. (As described previously, an integrated circuit is defined as a netlist of cells.) Each non-leaf node represents a cluster of cells, with nodes nearer the root of the tree representing larger clusters than nodes farther from the root of the tree. The root node represents a single large cluster of all of the cells (or cell instances) within the integrated circuit or a portion thereof.

A topocluster tree may be used to, in hierarchical fashion, obtain an advantageous initial placement of integrated circuit cells within an integrated circuit layout, as illustrated in FIG. 21. In general, the initial placement method works from the root node downward and uses successive bi-section to form layout areas for the right and left subtrees of a node. Hence, in the example of FIG. 20, beginning at the root node ABCD, the subtrees rooted at AB and CD, respectively, are identified. The total layout area is cut (bi-sected) to form two sub-areas, one for the cluster AB and one for the cluster CD. The areas of the two sub-areas are made roughly proportional to the size of the clusters. This process is then repeated multiple times. That is, the sub-area containing the cluster AB is further sub-divided into two sub-areas, a sub-area to contain the cluster A and a sub-area to contain the cluster B, by cutting the original sub-area in the opposite direction as the previous cut. Likewise, the sub-area containing the cluster CD is further sub-divided into two sub-areas, a sub-area to contain the cluster D and a sub-area to contain the cluster D, by cutting the original sub-area in the opposite direction as the previous cut. This process continues until the clusters reach some threshold of "smallness," e.g., until the sub-areas, or "bins," contain 10–20 cells. The resulting initial placement has been found to provide a very good starting point for subsequent placement refinement.

Figure 22:
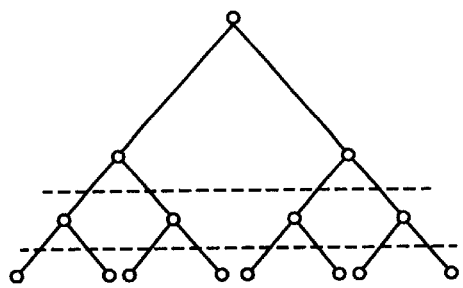
FIG. 22 is a diagram of a topocluster tree showing horizontal cuts used during placement refinement.
Figure 23:
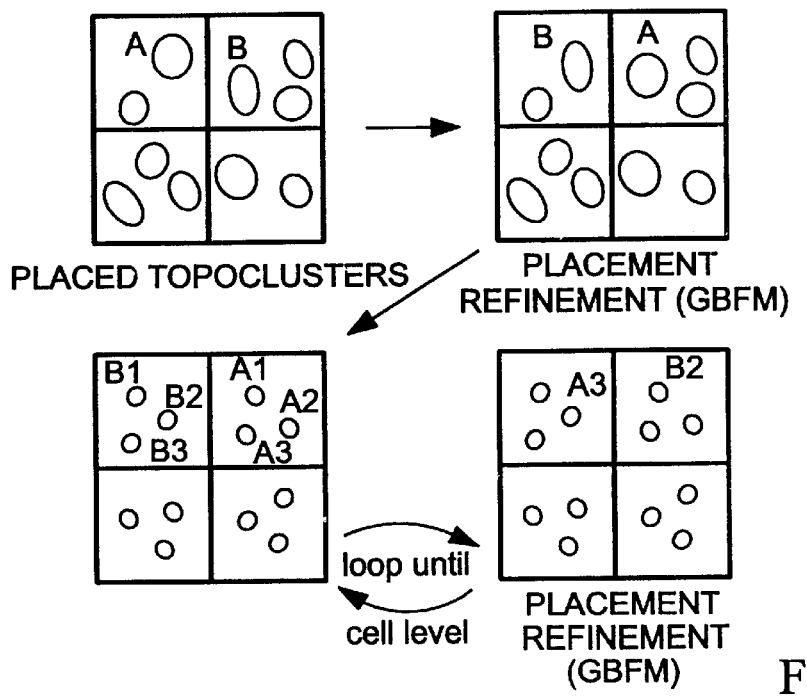
FIG. 23 is a diagram illustrating placement refinement using a topocluster tree such as that of FIG. 22.

Placement refinement may be performed using GBFM as described previously. More preferably, placement refinement is performed using a variant of GBFM that again takes advantage of topocluster trees in order to successively adjust cluster size from large to small as placement refinement proceeds. Referring to FIG. 22, as placement refinement proceeds, horizontal cuts are made within the topocluster tree at successively lower levels, which has the effect of adjusting cluster size from large to small. Placement refinement proceeds as shown in FIG. 23. That is, given an initial placement and an initial horizontal cut within the topocluster tree, GBFM is performed, during the course of which clusters of a size defined by the horizontal cut are moved between bins. There results a modified placement. A further horizontal cut is then made further down the topocluster tree. GBFM is performed again, this time with clusters of a new smaller size (defined by the new, lower horizontal cut) being moved between bins. This process continues in loop-wise fashion down to the cell level. That is, the final horizontal cut occurs between the leaves of the topocluster tree (defining individual cells) and their parent nodes.

Figure 24:
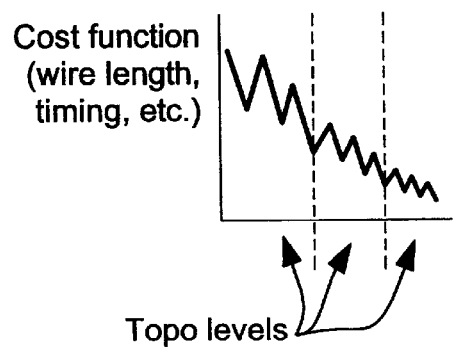
FIG. 24 is a graph of a cost function over the course of placement refinement and indicating topocluster level boundaries.

FIG. 24 shows an exemplary cost function curve during the foregoing placement refinement process. Here, the cost function is defined in terms 6f physical quantities, i.e., wire length, timing performance, etc. During placement refinement, the cost function trends downward while passing through relative maxima and minima. A new cut within the topocluster tree may be made when the cost function reaches an experimentally-determined threshold. After a cut has been made, the relative maxima and minima become closer together.

Placement refinement using GBFM involves quadrisection, as previously described. Quadrisection may be performed more intelligently using topocluster trees using a similar technique as in initial placement. Referring to FIG. 25, in order to perform quadrisection of a bin, reclustering is performed on that bin, during which a new cluster tree is built The bin is then bi-sected, with topoclusters of the right and left subtrees being placed into respective ones of the resulting smaller bins. The smaller bins are again bi-sected (in the opposite direction). New right and left subtrees of what were previously the right and left subtrees are placed into respective ones of the "quads."

The foregoing methods based on topocluster trees; are most effective when topocluster trees exhibit certain properties. In general, a topocluster tree is built from the bottom up by aggregation, by combining two connected cells or clusters that are not too big into a single aggregate cluster. This idea may be defined mathematically as follows.

Figure 26:
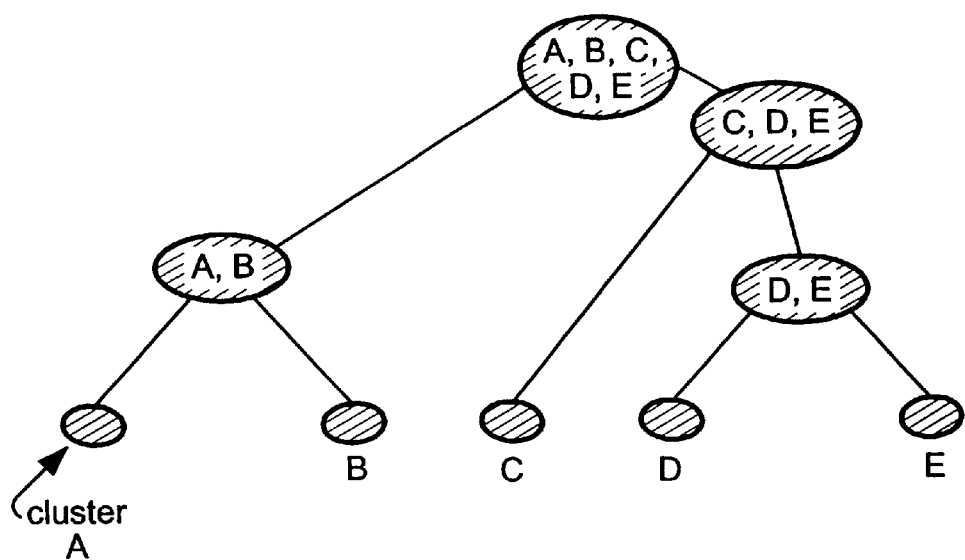
FIG. 26 is a further diagram of a topocluster tree.

In practice, topocluster trees will be less balanced than the idealized example of FIG. 20. A more realistic example of a topocluster tree is shown in FIG. 26. A generalized method for building topocluster trees in accordance with an exemplary embodiment will now be described. A first step in building a topocluster tree is to build a topocluster graph.

Figure 27:
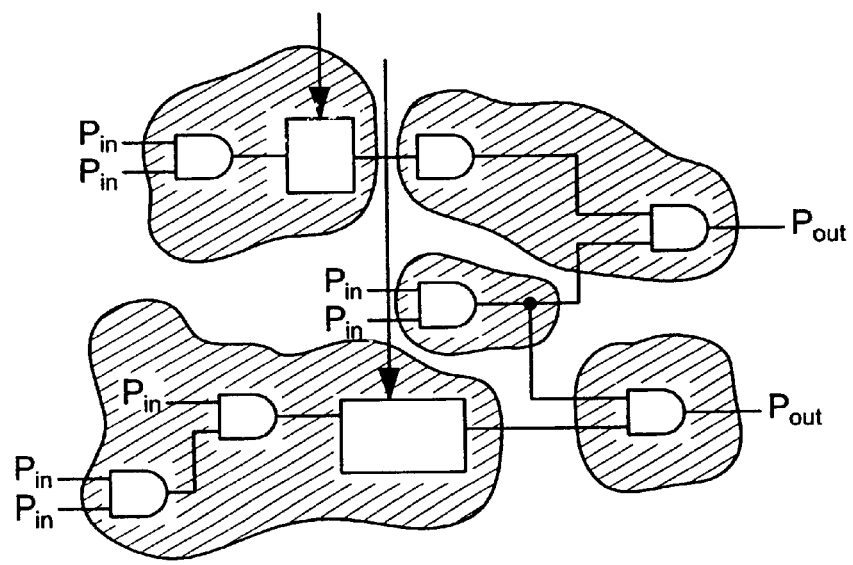
FIG. 27 is a diagram of a logic circuit useful in describing the manner of construction of topocluster trees.

Take as an example the circuit of FIG. 27, composed of primary inputs Pin, primary outputs Pout, gates (arbitrarily represented here as AND gates), and sequential elements, represented as boxes. The circuit is assumed to be represented by a netlist. The first step in constructing a corresponding topocluster graph is to divide the circuit netlist instances (e.g., gates) into "fan-out-free cones (FFCs) as illustrated in FIG. 27. Each FFC is represented as a node in the topocluster graph. For every net spanning multiple nodes (FFCs), an edge is generated between the nodes having a weight, which may be computed as follows:

$$\frac{1}{(\text{pins of net}) - 1}$$

For nodes connected by multiple edges, the multiple edges are combined into a single edge having a weight equal to the sum of the weights of the individual edges. The resulting graph is a topocluster graph wherein every node in the graph is a cluster.

To build a binary topocluster tree from the topocluster graph, each cluster within the topocluster graph is represented as a leaf node within the binary topocluster tree. For each possible cluster pair, the "connectivity" of that cluster pair is evaluated, and a connectivity ranking is performed. The two clusters having the highest connectivity are merged into a bigger cluster. This process proceeds iteratively. "Connectivity" of two clusters $C_i$ and $C_j$ may be defined in terms of the weights of their edges as follows:

$$\frac{C_{ij}}{C_i + C_j - 2C_{ij}}$$

where $C_i$ is the sum of the weights of edges connected to cluster $C_i$, $C_j$ is the sum of the weights of edges connected to cluster $C_j$, and $C_{ij}$ is the sum of the weights of edges connected to both clusters $C_i$ and $C_j$ FIG. 28A and FIG. 28B show the effect of cluster merger on the topocluster graph. In FIG. 28A, clusters A and B have been identified as clusters to be merged in accordance with their connectivity, given by:

$$\frac{w_1}{(w_1 + w_2) + (w_3 + w_1) - 2w_1}$$

Within the topocluster graph, edges between corresponding nodes are deleted and the nodes are replaced by a single node. If multiple edges connect the merged cluster to a given cluster, then those edges are replaced by a single edge having a weight equal to the sum of the weights of the multiple edges. Hence, in the illustrated example, the edges AB (weight $w_2$) and BC (weight $w_3$) in FIG. 28A are combined into a single edge (A,B)C (weight $w_2+W_3$) in FIG. 28B.

Instead of connectivity, "affinity" may be used, defined as:

$$A_{ij} = C_{ij} \cdot \frac{1}{A_i A_j}$$

By using affinity instead of connectivity, cluster size remains morel uniform.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.,

What is claimed is:

1. An automated method of placing integrated circuit cells within an integrated circuit layout, comprising:

forming topocluster by clustering cells based at least in part on topological considerations;

building a topocluster tree based at least in part on topological considerations: and using the topocluster tree to perform initial placement, wherein said using the topocluster tee to perform initial placement includes:

beginning at a root node of the tree identifying right and left subtrees of the topocluster tree;

dividing a layout area in proportion to respective sizes of the subtrees to produce first and second subdivisions of the layout area; and placing topoclusters belonging to the left subtree in the first subdivision and placing topoclusters belonging to the right subtree in the second subdivision.

2. The method of claim 1, comprising performing the steps of claim 1 respectively.

3. An automated method of placing integrated circuit cells within an integrated circuit layout, comprising:

forming topoclusters by clustering cells based at least in part on topological considerations;

building a topocluster tree bawd at least in part on topological considerations; and using the topocluster tree to perform placement refinement, wherein said using the topocluster tree to perform placement refinement includes:

defining a level of granularity for purposes of placement refinement by making at least one horizontal cut below a root node within the topocluster tree, wherein topoclusters above the cut are fee to move independently of one another, and topoclusters below the cut are constrained to move with a parent topocluster within the topocluster tree; and moving topoclusters between subdivisions of the layout area in accordance with a placement refinement strategy.

4. The method of claim 3, further comprising:

making a successive horizontal cut within the topocluster tee defining a finer level of granularity than defined by a preceding cut; and moving topoclusters between subdivisions of the layout ea in accordance: with a placement refinement strategy.

5. The method of claim 3, wherein the placement refinement strategy include quadrisection.

6. The method of claim 5, further comprising performing quadrisection by:

building a topocluster tree for a subdivision of the layout area;

identifying right and left subtrees of the topocluster tree;

further dividing the subdivision of the layout area in proportion to reeve sizes of the subtrees to produce first and second further subdivisions of the subdivision of the layout area; and placing topoclusters belonging to the left subtree in the first further subdivision and placing topoclusters belonging to the right subtree in the second further subdivision.

7. A computer readable medium containing instructions for performing an automated method of placing integrated circuit cells within an integrated circuit layout, the institutions performing steps comprising:
   forming topoclusters by clustering cells based at lent in part on topological considerations;
   building a topocluster tree bas at least in part on topological considerations; and
   using the topocluster tree to perform initial placement, wherein said using the topocluster tee to perform initial placement includes:
      beginning at a root node of the tree, identifying right and left subtrees of the topocluster tree;
      dividing a layout area in proportion to respective sizes of the subtrees to produce first and second subdivisions of the layout area; and
      placing topoclusters belonging to the left subtree in the first subdivision and placing topoclusters belonging to the right subtree in the second subdivision.

8. The computer readable medium of claim 7, further comprising instructions for performing the steps of claim 7 recursively.

9. A computer readable medium containing instructions for performing an automated method of placing integrated circuit cells within an integrated circuit layout, the instructions performing steps comprising:
   forming topocluster by clustering cells based at least in part on topological considerations;
   building a topocluster tee based at least in part on topological considerations; and
   us the topocluster tree to perform placement refinement, wherein said using the tops tree to perform placement refinement includes:
      defining a level of granularity for purposes of placement refinement by making at least one horizontal cut below the root node within the topocluter tree, wherein topoclusters above the cut are free to move independently of one another, and topoclusters below the cut are constrained to move with a parent topocluster within the topocluster tree; and
      moving topoclusters between subdivision of the layout area in accordance with a placement refinement strategy.

10. The computer readable medium of claim 9, further comprising instructions for:
   making a successive horizontal cut within the topocluster tree defining a finer level of than defined by a preceding cut; and
   moving topoclusters between subdivisions of the layout area in accordance with a placement refinement strategy.

11. The computer readable medium of claim 9, wherein the placement refinement strategy include quadrisection.

12. The computer able medium of claim 11, further comprising instructions for performing quadrisection by:
   building a topocluster tree for a subdivision of the layout area;
   identifying right and left subtrees of the topocluster tree;
   further dividing the subdivision of the layout area in proportion to reeve sizes of the subtrees to produce first and second further subdivisions of the subdivision of to layout area; and
   placing topoclusters belonging to the left subtree in the first further subdivision and placing topocluster belong to the right subtree in to second further subdivision.

13. An automated method of placing integrated circuit cells within an integrated circuit layout said method comprising the steps of:
   building a topocluster tree based at least in part on topological considerations;
   beginning at a root node of the tree, identifying a set of subtrees in said topocluster tree, wherein said set of subtrees includes at least a first subtree having a first set of clusters and a second subtree having a second set of clusters;
   dividing a layout area into a plurality of subdivisions, wherein said plurality of subdivisions includes at least a first subdivision and a second subdivision;
   placing said first set of clusters in said first subdivision; and
   placing said second set of clusters in said second subdivision.

14. The method of claim 13, wherein subdivisions in said plurality of subdivisions are in proportion to respective sizes of subtrees in said se of subtrees.

15. The method of claim 13, wherein said method further includes the steps of:
   identifying a first set of subtrees in said first subtree, wherein said first set of subtrees includes at least a third subtree having a third set of clusters and a fourth subtree having a fourth set of clusters;
   identifying a second set of subtrees in said second subtree, wherein said second set of subtrees includes at least a fifth subtree having a fifth set of clusters and a sixth subtree having a sixth set of clusters;
   dividing said first subdivision into a first plurality of subdivisions, wherein said first plurality of subdivisions includes at last a third subdivision and a fourth subdivision;
   dividing said second subdivision into a second plurality of subdivisions, wherein said second plurality of subdivisions includes at least a fifth subdivision and a sixth subdivision;
   placing said third set of clusters in said third subdivision;
   placing said fourth set of clusters in said fourth subdivision;
   placing said fifth set of clusters in said fifth subdivision; and
   placing said sixth set of clusters in said sixth subdivision.

16. The method of claim 15, wherein said first set of cluster, said second set of clusters, said third set of clusters, and said fourth set of clusters are sets of topoclusters.

17. The method of claim 13, wherein said method is performed as part of an initial placement.

18. The method of claim 13, wherein said method is preformed as part of a quadrisection.

19. The method of claim 13, wherein said step of building a topocluster tree includes the steps of:
   building a topocluster graph having a plurality of clusters
   evaluating each pair of clusters in said plurality of clusters; and
   merging at least one pair of clusters in said plurality of clusters based on said step of evaluating.

20. The method of claim 19, wherein said step of evaluating includes the step of:
   determining a connectivity for each pair of clusters in said plurality of clusters.

21. The method of claim 19, wherein said step of evaluating includes the step of determining an affinity for each pair of clusters in said plurality of clusters.

22. The method of claim 19, wherein said step of building a topocluster graph includes the steps of:
   dividing circuit netlist instances in a netlist into fan-out-fee cones; and
   generating a weighted edge for every net spanning multiple fan-out-free cones.

23. An automated method of playing integrated circuit cells within an integrated circuit layout area, said method comprising the steps of:
   building a topocluster tree based at least in part on topological considerations;
   making a cut within said topocluster tree, wherein said cut creates a first set of topoclusters free to move independently of one another and a second set of topocluster constrained to move with a parent topocluster within said topocluster tree; and
   moving topocluster in said topocluster tree between subdivisions of said integrated circuit layout area in accordance with a placement refinement strategy.

24. The method of claim 23, wherein said method further comprises the steps of:
   building a second topocluster tree for at least one subdivision in said subdivisions; and
   performing a quadrisection of said at least one subdivision using said second topocluster tree.

25. The method of claim 24, wherein said method further includes the step of performing an initial placement using said topocluster bee.

26. One or more processor readable storage deices having processor readable code embodied on said one or more processor readable storage devices, said processor readable code for programming one or more processors to preform a method for placing integrated circuit cells within an integrated circuit layout, said method comprising the steps of:
   building a topocluster tree based at least in part on topological considerations,
   beginning at a root node of the tee, identifying a set of subtrees in said topocluster tree, wherein said set of subtrees includes at least a first subtree having a first set of clusters and a second subtree having a second set of clusters;
   dividing a layout area into a plurality of subdivisions, when said plurality of subdivisions includes at least a fist subdivision and a sec subdivision;
   placing said fist set of clusters in said fist subdivision; and
   placing said second set of clustering in said second subdivision.

27. One or more processor readable storage devices according to claim 26, wherein subdivisions in said plurality of subdivisions are in proportion to respective sizes of subtrees in said set of subtree.

28. One or more processor readable storage devices according to claim 26, wherein said method further includes tee steps of
   identifying a fist set of subtrees in said first subtree, wherein said fist set of subtrees includes at least a td subtree having a third set of clusters and a fourth subtree having a fourth set of clusters;
   identifying a second set of subtrees in said second subtree, wherein said second set of subtrees includes a least a fifth subtree having a fifth set of clusters and a sixth subtree having a sixth set of clusters;
   dividing said lint subdivision into a first plurality of subdivisions, wherein said fiat plurality of subdivisions includes at least a third subdivision and a fourth subdivision;
   dividing said second subdivision into a second plurality of subdivisions, wherein said second plural of subdivisions includes at least a fifth subdivision and a sixth subdivision;
   placing said third set of clusters in said third subdivision;
   placing said fourth set of clusters in said fourth subdivision;
   placing said fifth set of clusters in said fifth subdivision; and
   placing said sixth set of clusters in said sixth subdivision.

29. One or more processor readable storage devices according to claim 28, wherein said first set of clusters, said second set of clusters, said third set of clusters, and said fourth set of clusters are sets of topoclusters.

30. One or more processor readable storage devices according to claim 28, wherein said step of building a topocluster tree includes the steps of:
   building a topocluster graph having a plurality of clusters;
   evaluating each pair of clusters in said plurality of clusters; and
   merging at least one pair of clusters in said plurality of clusters based on said step of evaluating.

31. One or more processor readable storage devices according to claim 30, wherein said step of evaluating the step of:
   determining a connectivity fir each pair of clusters said plurality of clusters.

32. One or more processor readable storage devices according to claim 30, wherein said step of evaluating includes the step of:
   determining a affinity for each pair of clusters in said plurality of clusters.

33. One or more processor readable storage devices having processor readable code embodied on said one or more processor readable storage devices, said processor readable code for programming one or more processors to perform a method for placing integrated circuit cells within an integrated circuit layout area, said method comprising it steps of:
   building a topocluster tree based at least in part on topological considerations;
   making a cut within said topocluster tree, wherein said cut as a first set of topoclusters free to move independently of one another and a second set of topoclusters constrained to move with a parent topocluster within said topocluster tree; and
   moving topoclusters in said topocluster tree between subdivisions of said integrated circuit layout area in accordance with a placement refinement strategy.

34. One or more processor readable storage devices according to claim 33, wherein said method further comprises the steps of:
   building a second topocluster tree for at least one subdivision in said subdivisions; and
   performing a quadrisection of said at least one subdivision using said second topocluster tree.

35. One or more processor readable storage devices according to Claim 34, wherein said method further includes the step of:
   performing an initial placement using sad topocluster tree.

36. An apparatus comprising:
   one or more storage devices; and
   one or more processors in communication with said one or more storage devices, said one or more processors programmed to perform a method for placing integrated circuit cells within an circuit layout, said method comprising the steps of:

building a topocluster tree based at least in part on topological considerations;

beginning at a root node of the tree identifying a set of subtrees in said topocluster tree when said set of subtrees includes at least a fist subtree having a first set of clusters and a second subtree having a second set of clusters;

dividing a layout area into a plurality of subdivisions, wherein said plurality of subdivisions includes at lent a first subdivision and a second subdivision;

placing said first set of clusters in said fit subdivision; and placing said second set of cluster in said second subdivision.

37. The apparatus of claim 36, wherein subdivisions in said plurality of subdivisions are in proportion to respective sizes of subtrees in said set of subtrees.

38. The apparatus of claim 36, wherein said method further includes the steps of:

identifying a first set of subtrees in said first subtree, wherein said first set of includes at least a third subtree having a third set of clusters and a fourth subtree having a fourth set of clusters;

identifying a second set of subtrees in said second subtree, wherein said second set of subtrees includes at least a fifth subtree having a fifth set of clusters and a sixth subtree having a set of clusters;

dividing said first subdivision into a first plurality of subdivisions, wherein said first plurality of subdivisions includes at least a third subdivision and a fourth subdivision;

dividing said second subdivision into a second plurality of subdivisions wherein said second plurality of subdivisions includes at least a fifth subdivision and a sixth subdivision;

placing said third set of clusters in said third subdivision;

placing said fourth set of clusters in said fourth subdivision;

placing said fifth set of clusters in said fifth subdivision; and placing said sixth set of cluster in said sixth subdivision.

39. The apparatus of claim 36, wherein said step of building a topocluster tree includes the steps of:

building a topocluster having a plurality of clusters;

evaluating each pair of clusters in said plurality of clusters; and merging at least one pair of clusters in said plurality of clusters based on said step of evaluating.

40. An apparatus, comprising one or more storage devices; and one or more processors in communication with said one or more storage devices; said one or more processors programmed to perform a method for placing integrated circuit cells within an integrated circuit layout area, said method comprising the steps of:

building a topocluster tree wherein at lest in part on topological considerations;

making a cut within said topocluster tree, wherein said cut creates a first set of topoclusters free to move independently of one another and a second set of topoclusters constrained to move writ a parent topocluster within said topocluster tree; and moving topoclusters in said topocluster tree between subdivisions of said integrated circuit layout area in accordance with a placement refinement strategy.

41. The apparatus of claim 40, wherein said method further comprises the steps of:

building a second topocluster tree for at least one subdivision in said subdivisions; and performing a quadrisection of said at least one subdivision using said second topocluster tree.

42. The apparatus of claim 41, wherein said method further includes the step of:

performing an initial placement using said topocluster tree.

* * * * *

UNITED STATES PATENT AND TRADEMARK OFFICE
CERTIFICATE OF CORRECTION

PATENT NO.    : 6,851,099 B1
DATED         : February 1, 2005
INVENTOR(S)   : Majid Sarrafzadeh et al.

It is certified that error appears in the above-identified patent and that said Letters Patent is hereby corrected as shown below:

Column 10,
Line 26, insert -- further -- before "comprising".
Line 32, replace "bawd" with -- based --.
Line 49, replace "tee" with -- tree --.
Line 52, replace "ea" with -- area --.
Line 61, replace "reeve" with -- respective --.

Column 11,
Line 3, replace "institutions" with -- instructions --.
Line 5, replace "lent" with -- least --.
Line 7, replace "bas" with -- based --.
Lines 10 and 30, replace "tee" with -- tree --.
Line 32, replace "us" with -- using --.
Line 33, replace "tops" with -- topocluster --.
Line 37, replace "topocluter" with -- topocluster --
Line 48, insert -- granularity -- before "than".
Line 55, replace "able" with -- readable --.
Line 61, replace "reeve" with -- respective --.
Line 62, replace "to" with -- the --.
Line 66, replace "topocluster" with -- topoclusters --.
Line 66, replace "belong" with -- belonging --.
Line 67, replace "to" (second occurrence) with -- the --.

Column 12,
Line 2, insert a comma after "layout".
Line 21, replace "se" with -- set --.
Line 67, insert a colon after "of".

Column 13,
Line 6, replace "fee" with -- free --
Line 19, replace "topocluster" with -- topoclusters --.
Line 29, insert a colon after "of".
Line 30, replace "bee" with -- tree --.
Line 31, replace "deices" with -- devices --.
Line 34, replace "preform" with -- perform --.
Line 39, replace "tee" with -- tree --
Line 44 replace "when" with -- wherein --.
Line 45, replace "fist" with -- first --
Line 45, replace "sec" with -- second --.
Line 46, replace "fist" (first occurrence) with -- first --.
Line 46, replace "fist" (second occurrence) with -- first --.

UNITED STATES PATENT AND TRADEMARK OFFICE
CERTIFICATE OF CORRECTION

PATENT NO. : 6,851,099 B1
DATED : February 1, 2005
INVENTOR(S) : Majid Sarrafzadeh et al.

It is certified that error appears in the above-identified patent and that said Letters Patent is hereby corrected as shown below:

Column 13 (cont'd),
Line 47, replace "clustering" with -- clusters --.
Line 52, replace "subtree" with -- subtrees --.
Line 55, replace "tee" with -- the --.
Line 55, insert a colon after "of".
Lines 56 and 57, replace "fist" with -- first --.
Line 57, replace "td" with -- third --.
Line 64, replace "lint" with -- first --.
Line 65, replace "fiat" with -- first --

Column 14,
Line 2, replace "plural" with -- plurality --.
Line 17, replace "28" with -- 26 --.
Line 25, insert -- includes -- after "evaluating".
Line 27, replace "fir" with -- for --.
Line 27, insert -- in -- before "said".
Line 32, replace "a" with -- an --.
Line 39, replace "it" with -- the --.
Line 43, insert -- creates -- after "cut".
Line 44, delete "as".
Line 63, replace "sad" with -- said --.

Column 15,
Line 2, insert -- integrated -- before "circuit".
Line 7, insert a comma after "tree".
Line 7, replace "when" with -- wherein --.
Line 8, replace "fist" with -- first --.
Line 13, replace "lent" with -- least --.
Line 14, replace "fit" with -- first --.
Line 24, insert -- subtrees -- before "includes".
Line 30, insert -- sixth -- before "set".

Column 16,
Line 6, insert -- graph -- before "having".
Line 16, replace the semicolon after "devices" with a comma.
Line 20, replace "wherein" with -- based --.
Line 20, replace "lest" with -- least --.

UNITED STATES PATENT AND TRADEMARK OFFICE
CERTIFICATE OF CORRECTION

PATENT NO.     : 6,851,099 B1
DATED          : February 1, 2005
INVENTOR(S)    : Majid Sarrafzadeh et al.

It is certified that error appears in the above-identified patent and that said Letters Patent is hereby corrected as shown below:

<u>Column 16 (cont'd),</u>
Line 25, replace "writ" with -- with --.

Signed and Sealed this

Seventh Day of June, 2005

JON W. DUDAS
*Director of the United States Patent and Trademark Office*